United States Patent
Koizumi et al.

[11] Patent Number: 5,943,586
[45] Date of Patent: Aug. 24, 1999

[54] LED ARRAY ALIGNMENT MARK, METHOD AND MASK FOR FORMING SAME, AND LED ARRAY ALIGNMENT METHOD

[75] Inventors: Masumi Koizumi; Yukio Nakamura; Masaharu Nobori; Aya Yamanaka, all of Tokyo, Japan

[73] Assignee: Oki Electric Industry Co., Ltd., Tokyo, Japan

[21] Appl. No.: 08/768,184

[22] Filed: Dec. 17, 1996

[30] Foreign Application Priority Data

Dec. 26, 1995 [JP] Japan ................................. 7-338617

[51] Int. Cl.$^6$ ..................................................... H01L 21/76
[52] U.S. Cl. ............................. 438/401; 438/22; 257/797
[58] Field of Search ........................ 438/401, 22; 257/797

[56] References Cited

U.S. PATENT DOCUMENTS

| | | |
|---|---|---|
| 5,042,709 | 8/1991 | Cina et al. . |
| 5,173,759 | 12/1992 | Murano . |
| 5,554,251 | 9/1996 | Watanabe et al. . |
| 5,606,181 | 2/1997 | Sukama et al. . |
| 5,679,588 | 10/1997 | Choi et al. . |

FOREIGN PATENT DOCUMENTS

| | | |
|---|---|---|
| 0 310 267 | 4/1989 | European Pat. Off. . |
| 0 335 074 | 10/1989 | European Pat. Off. . |
| 0 364 077 | 4/1990 | European Pat. Off. . |
| 59-164161 | 9/1984 | Japan . |
| 63-30271 | 2/1988 | Japan . |
| 5-190899 | 7/1993 | Japan . |
| 06286218 | 10/1994 | Japan . |

*Primary Examiner*—Charles Bowers
*Assistant Examiner*—Martin Sulsky
*Attorney, Agent, or Firm*—Venable; Robert J. Frank; Catherine M. Voorhees

[57] ABSTRACT

An alignment mark on a light-emitting diode (LED) array chip is formed together with the light-emitting areas of the diodes in the array, by use of a combined mask having a first part and a second part. An impurity is introduced through windows in the first part to form the light-emitting areas. Next the windows are covered with an etching resist, and the chip substrate is etched to create a topographic relief feature defined by the second part of the mask. This topographic relief feature is used as an alignment mark. When LED array chips having these alignment marks are mounted on a supporting surface, they are aligned by recognizing patterns of light reflected from the topographic relief, thereby detecting the positions of the alignment marks.

13 Claims, 14 Drawing Sheets

LED ARRAY ALIGNMENT MARK, METHOD AND MASK FOR FORMING SAME, AND LED ARRAY ALIGNMENT METHOD

BACKGROUND OF THE INVENTION

The present invention relates to an alignment mark for a light-emitting diode array (referred to below as a LED array), a method of forming the alignment mark, a combined mask employed in this method to form both the alignment mark and the light-emitting diffusion areas in the LED array, and a method of using the alignment mark to align a LED array.

LED arrays can be employed as light sources in electrophotographic printing. Since a linear array of more than a thousand light-emitting elements may be required, the array is normally divided into a plurality of LED array chips, each chip containing part of the array. The LED array chips, and the driver chips containing the LED-array driving circuitry, are bonded to a printed circuit board or other supporting surface. Alternatively, the driver chips are bonded to the printed circuit board, and the LED array chips are piggy-backed onto the driver chips, to save space.

For good printing quality, the light-emitting elements in the array must be evenly spaced. For a printer that prints six hundred dots per inch (600 dpi), for example, the light-emitting elements must be spaced at a pitch of 42.3 micrometers ($\mu$m), with a tolerance of substantially ±10 $\mu$m. This requirement also applies to the light-emitting elements at the ends of adjacent LED array chips. Thus the LED array chips need to be aligned very accurately with one another. For this purpose, alignment marks are necessary on the LED array chips.

A typical LED array chip comprises a gallium-arsenide (GaAs) substrate with a gallium-arsenide-phosphide (GaAsP) epitaxial layer, in which the light-emitting elements are formed by diffusion of a zinc impurity through windows in a diffusion mask. Electrodes of a metal such as aluminum are then formed in a separate step, using a separate mask.

One known method of forming alignment marks is to provide additional windows in the diffusion mask, in which case the alignment marks consist of the same diffused impurity material (zinc) as the light-emitting elements. A disadvantage of this method is that the alignment marks have low contrast and are difficult to detect accurately.

Another known method is to form the alignment marks during the electrode-formation step, in which case the alignment marks comprise the same material (e.g. aluminum) as the electrodes. Alignment marks with good contrast can be obtained in this way, but since the light-emitting diffusions and alignment marks are formed in separate steps, the alignment marks may not be accurately positioned in relation to the light-emitting elements. This is particularly true in the usual case in which a large number of LED array chips are fabricated on a single GaAs wafer. Growth of the GaAsP epitaxial layer tends to warp the wafer, making it practically impossible to align the diffusion mask and the electrode-formation mask accurately over the entire wafer surface.

If the LED array chips are piggy-backed onto the driver chips, first each LED array chip is attached to its driver chip to form a module, then the modules are bonded onto the printed circuit board, so alignment marks are necessary on both the LED array chips and driver chips. To ensure adequate contrast, the alignment marks on the LED array chips conventionally comprise electrode metal as in the second method described above, even though that means accepting a certain degree of misalignment when the modules are assembled. When the modules are bonded to the printed circuit board, they are aligned by means of the alignment marks on the driver chips, and further misalignment tends to occur due, for example, to slippage at the adhesive interface in the bonding process. Thus an accurately aligned LED array is difficult to achieve.

SUMMARY OF THE INVENTION

It is accordingly an object of the present invention to provide an accurately-positioned, high-contrast alignment mark on a LED array chip.

Another object of the invention is to provide a method of forming such an alignment mark.

Still another object is to provide a combined mask that can be used to form both light-emitting areas of light-emitting diodes and high-contrast alignment marks.

Yet another object is to provide a method of aligning a LED array using alignment marks on the LED array chips.

The invented alignment mark comprises a topographic relief feature in the semiconductor substrate of a LED array chip. This topographic relief feature is formed in a precise positional relationship to the light-emitting areas in the LED array chip.

The invented method of forming the alignment mark and light-emitting diodes begins by forming a mask on the surface of the semiconductor substrate. The mask has a first part with windows for creating the light-emitting diodes, and a second part for creating the alignment mark. Where not covered by the mask, the semiconductor substrate is doped with an impurity, thereby forming the light-emitting areas of the light-emitting diodes. Next an extent of the first part of the mask including at least the windows is covered with an etching resist, and the semiconductor substrate is etched with an etchant that does not etch the etching resist and does not etch the mask, thereby creating a topographic relief feature, disposed below the second part of the mask, that constitutes the alignment mark.

The invented mask comprises a first part and a second part as described above. The second part is, for example, a rectangular projection from or recess in an edge of the first part.

The invented alignment method aligns a plurality of LED array chips, having alignment marks as described above, on a supporting surface having a reference mark. A first LED array chip is aligned in relation to the reference mark, by detecting the relative positions of the reference mark and an alignment mark on the first LED array chip. A second LED array chip is then aligned with the first LED array chip, by detecting the relative positions of alignment marks on the two LED array chips. Successive LED array chips are aligned with one another in the same way. The alignment marks are detected by illuminating the LED array chips from a predetermined angle and detecting dark-light patterns, produced by the topographic relief of the alignment marks, in the reflected light.

DETAILED DESCRIPTION OF THE INVENTION

The invention will now be described by way of example through the embodiments shown in the drawings. Embodiments of the invented alignment mark, alignment mark formation method, mask, and alignment method will be illustrated in separate drawings, but the same reference numerals will be used for the same elements in different drawings. Shapes and positional relationships shown in the drawings are only approximate, and do not limit the scope of the invention.

Figure 1A:
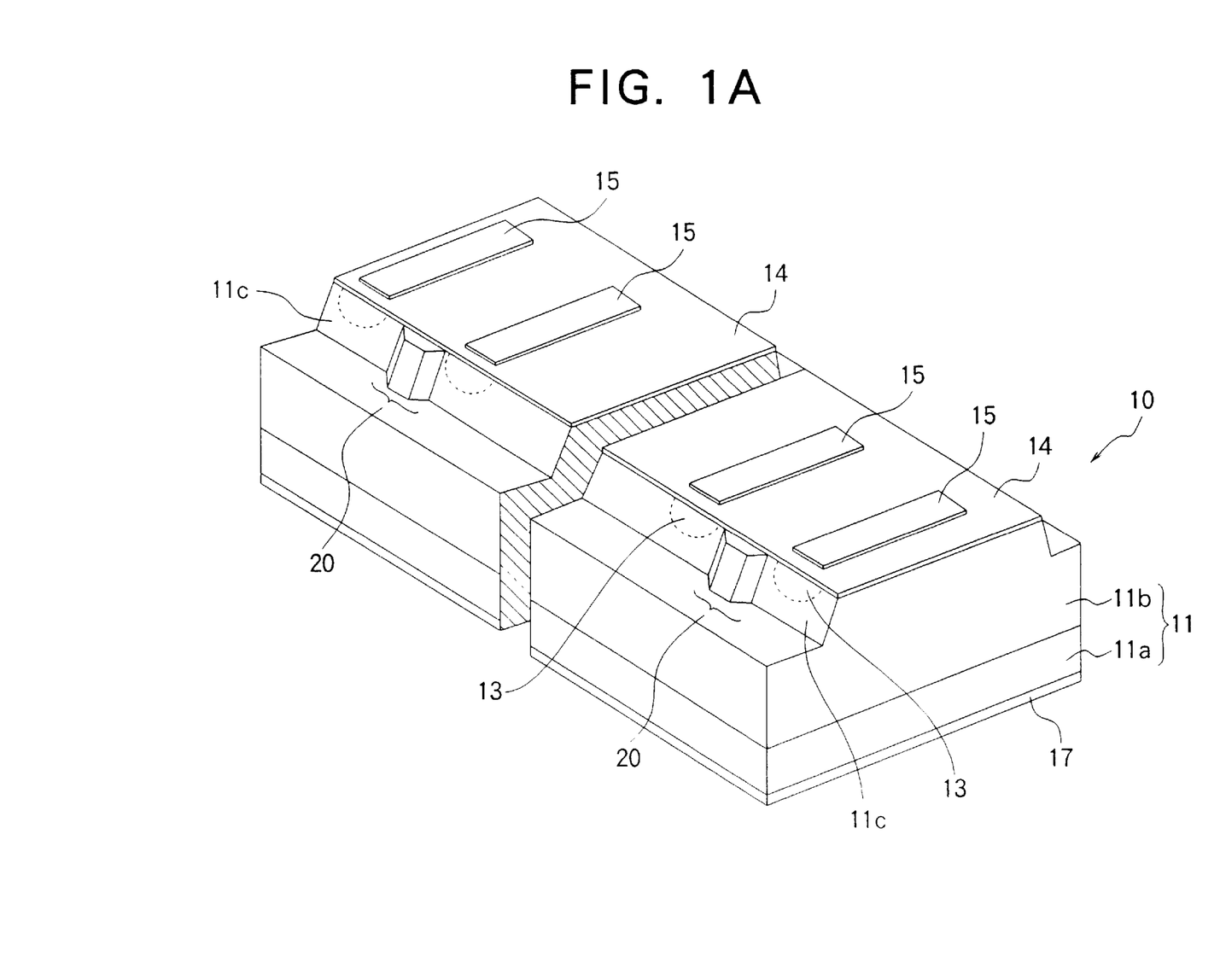
FIGS. 1A, 1B, 1C, and 1D are partial perspective views of pairs of LED array chips having alignment marks of the invented type.

An embodiment of the invented alignment mark is illustrated in FIG. 1A, which shows a pair of LED array chips 10 placed end-to-end as part of a LED array. Each chip 10 has an n-type compound semiconductor substrate 11 comprising a GaAs layer 11a and a GaAsP epitaxial layer 11b. The substrate 11 has been etched to form an emitting facet 11c, and light-emitting areas 13 have been formed by diffusion just behind this facet 11c. Part of the diffusion mask is left in place as an aluminum oxide ($Al_2O_3$) film 14 with windows, which are covered by p-electrodes 15. A common n-electrode 17 is formed on the GaAs surface opposite from the p-electrodes 15. The LED array chip 10 is an edge-emitting device, the facet 11c being the emitting edge.

The alignment marks 20 are topographic relief features in the emitting facet 11c, formed in a precise, predetermined positional relationship to the light-emitting areas 13. In this embodiment, each alignment mark is a trapezoidal projection from the emitting facet 11c, formed midway between the last two light-emitting areas 13 at an end of the chip 10. Each LED array chip 10 has two alignment marks 20, one at each end.

Figure 1B:
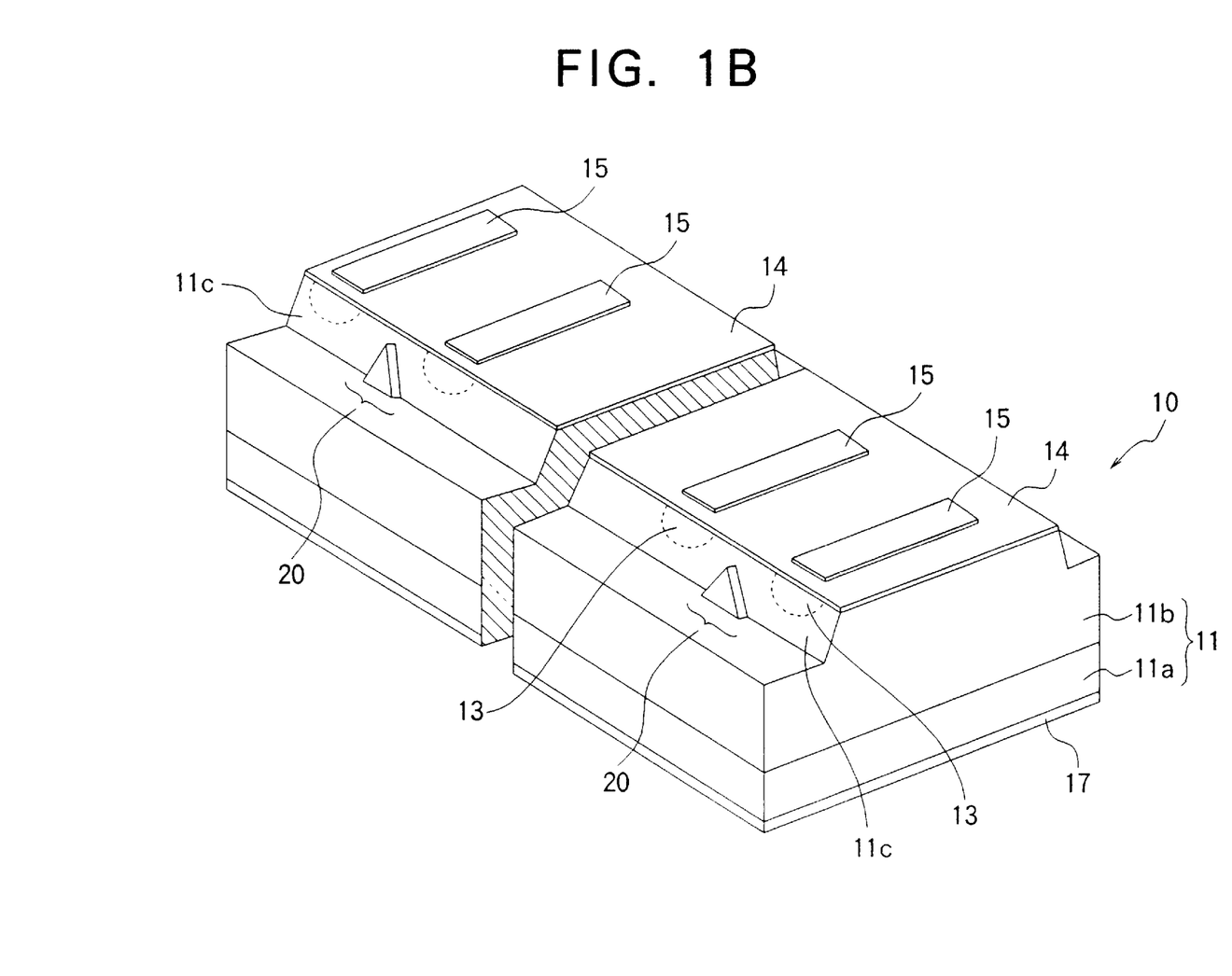
Figure 1C:
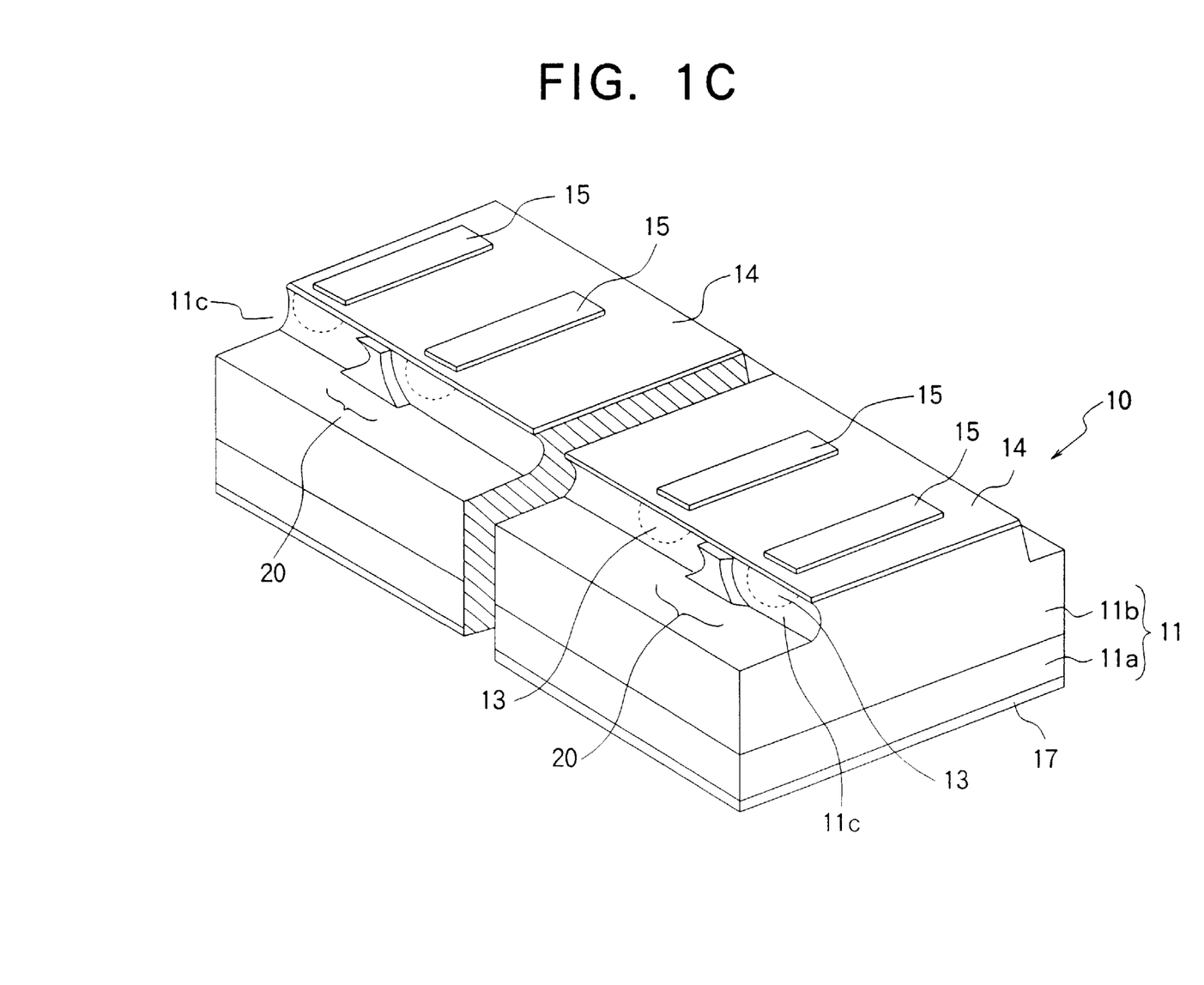
Figure 1D:
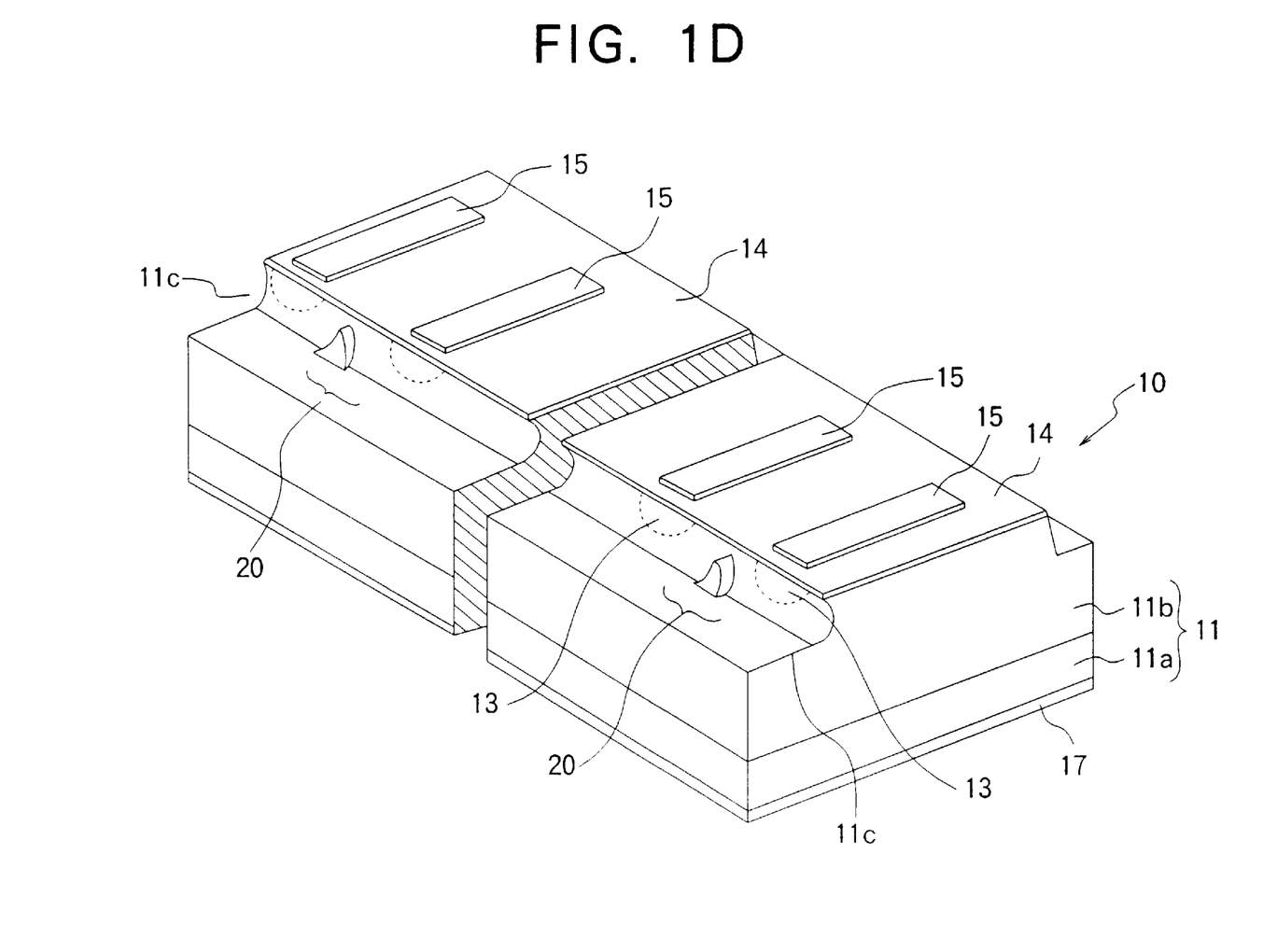

The invention is not limited to alignment marks 20 of this specific type. FIGS. 1B, 1C, and 1D show a few examples of other types of alignment marks that can be used. These alignment marks can be obtained by changing the mask size or mesa etching depth, or altering the wafer orientation of the LED array chips, as described later.

Nor is the invention limited to two alignment marks per chip. In general each LED array chip 10 may have any number of alignment marks, which may have arbitrary shapes and may be formed in any positions. The alignment marks may comprise either projections from or depressions in the substrate, and may be formed in any convenient substrate facet or surface. The essential requirement is a predetermined and precise positional relationship between the alignment marks and light-emitting areas.

Next, the fabrication of the LED array chips 10 and their alignment marks 20 will be described.

The LED array chips 10 are fabricated from a GaAs wafer on which a GaAsP epitaxial layer is grown. A description of the well-known epitaxial growth process will be omitted.

Figure 2:
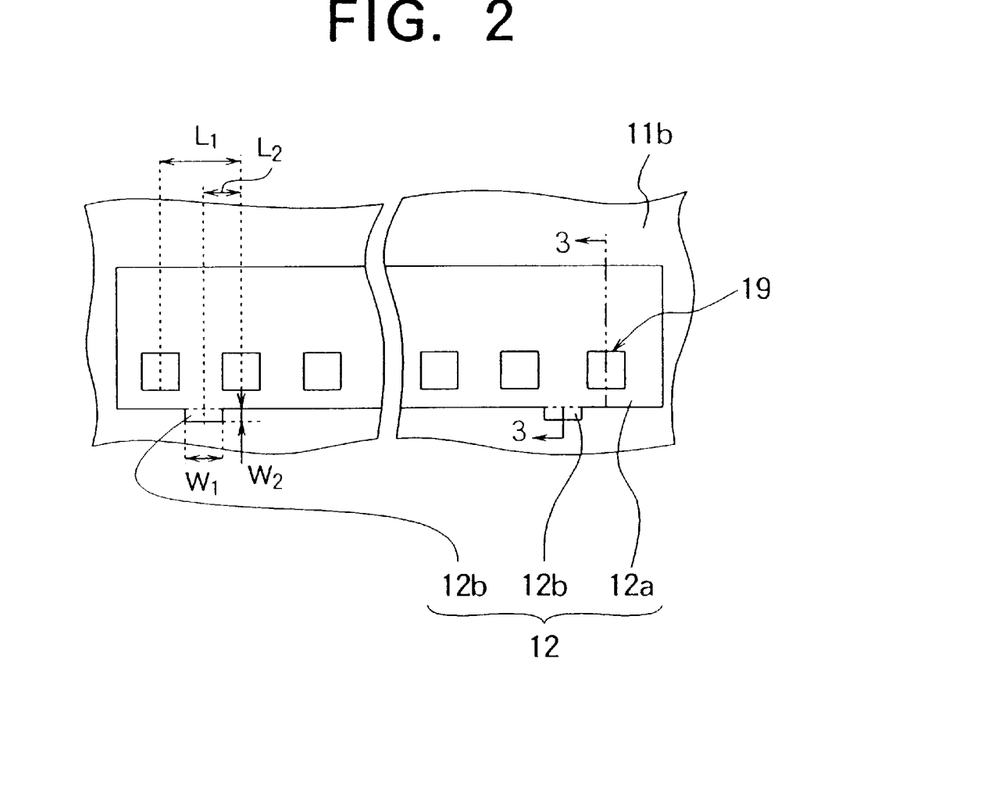
FIG. 2 is a plan view illustrating a first step in a fabrication process for the LED array chip in FIG. 1A.

Referring to FIG. 2, after the epitaxial layer 11b has been grown, it is covered with an $Al_2O_3$ film, which is patterned by standard photolithography (etched by hot phosphoric acid, for example) to form a combined mask 12. The combined mask 12 comprises a first part 12a with diffusion windows 19 defining the light-emitting areas 13, and two second parts 12b comprising rectangular projections from an edge of the first part, which define the alignment marks 20. The first and second parts 12a and 12b of the combined mask 12 are shown separated by dashed lines in FIG. 2, but there is no physical boundary between them; physically, there is only a single patterned film of $Al_2O_3$.

The array resolution in the present embodiment is 600 dpi, so the diffusion windows 19 are formed at intervals $L_1$ of 42.3 µm. The second parts 12b of the combined mask 12 are formed midway between the two diffusion windows 19 at each end of the chip. The distance $L_2$ between the centers of the diffusion windows 19 and the centers of the second parts 12b is thus 21.15 µm. The width $W_1$ of each second part 12b is 20 µm, in anticipation of side etching of about 8 µm in a subsequent step (described below). The dimension $W_2$ of the second parts 12b in the direction perpendicular to $W_1$ is in the range from 3 µm to 5 µm.

Incidentally, if $W_1$ is reduced to a value less than 8 µm, the triangular alignment marks 20 shown in FIG. 1B are obtained. If the chips are oriented so that their arrays of light-emitting areas 13 are parallel to the $(01\overline{1})$ plane of the GaAs substrate 11a, then alignment marks 20 with the pinched shape shown in FIG. 1C are obtained when $W_1$ is 20 µm, and alignment marks 20 with the curved triangular shape shown in FIG. 1D are obtained when $W_1$ is less than 8 µm. The pinched shape in FIG. 1C comprises a narrow part disposed between two wider parts.

Figure 3:
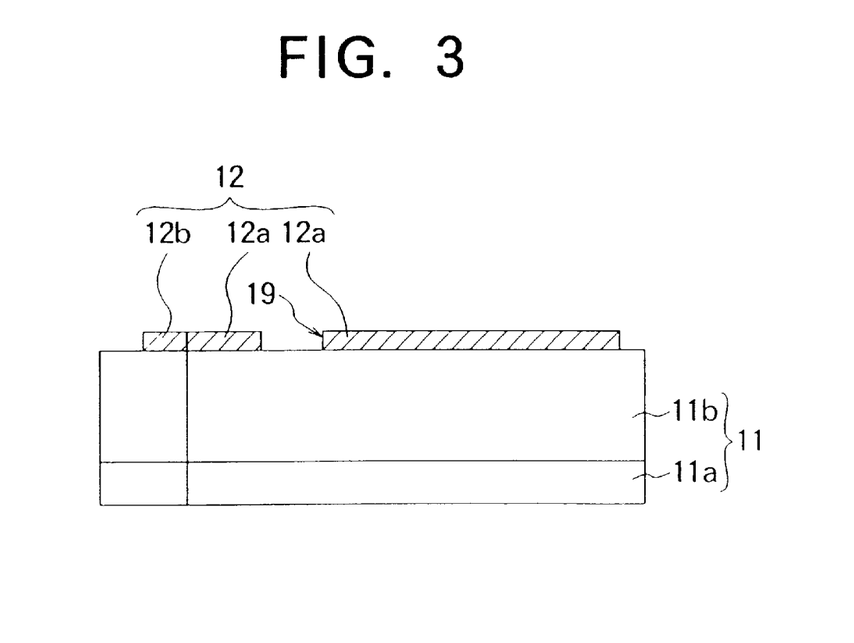
FIG. 3 is a sectional view through line 3—3 in FIG. 2.

FIG. 3 is a sectional view through the broken line 3—3 in FIG. 2, illustrating the two parts 12a and 12b of the combined mask 12, the two layers 11a and 11b of the substrate 11, and a diffusion window 19.

Figure 4:
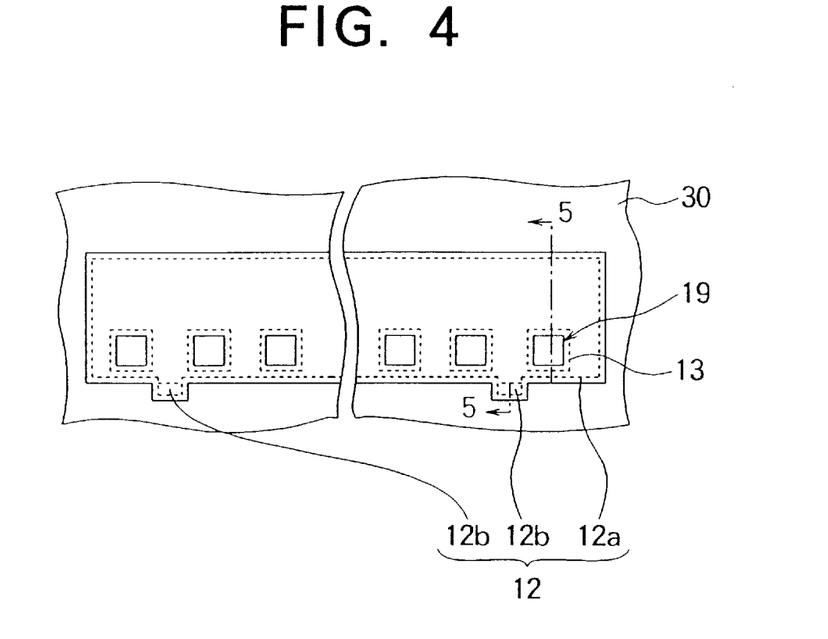
FIG. 4 is a plan view illustrating a second step in the above fabrication process.

Referring to FIG. 4, the wafer surface is now covered with a diffusion control film 30, and is doped by diffusing an impurity into the epitaxial layer 11b, except where the epitaxial layer 11b is covered by the combined mask 12. In the present embodiment, in which the epitaxial layer 11b comprises an n-type (electron donor) semiconductor material, the impurity must be a p-type (electron acceptor) material. Zinc, for example, can be employed as the impurity. Dotted lines are used in the drawing to indicate the boundaries of the diffusion regions. The diffusion regions below the diffusion windows 19 become the light-emitting areas 13.

Figure 5:
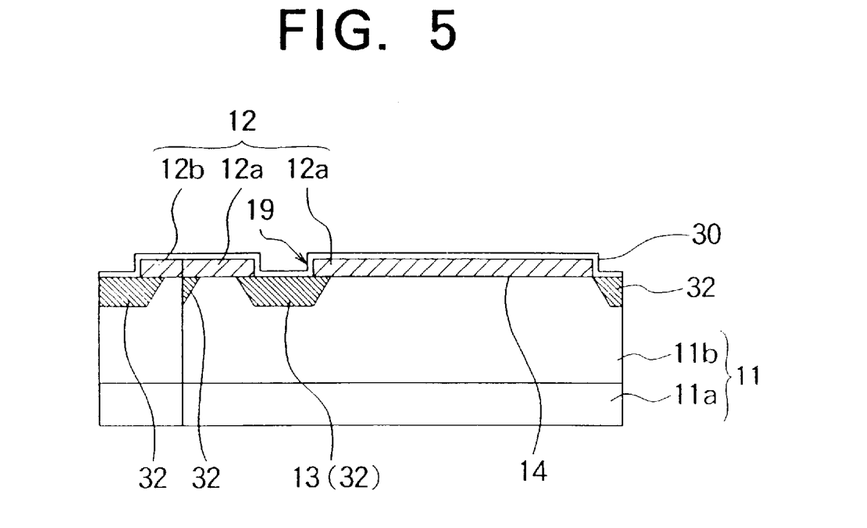
FIG. 5 is a sectional view through line 5—5 in FIG. 4.

FIG. 5 shows a sectional view through the broken line 5—5 in FIG. 4. Diffusion regions 32 are formed not only below the diffusion windows 19 but also in other areas not covered by the combined mask 12. The depth of the diffusion regions 32 is, for example, substantially 5 µm.

Figure 6:
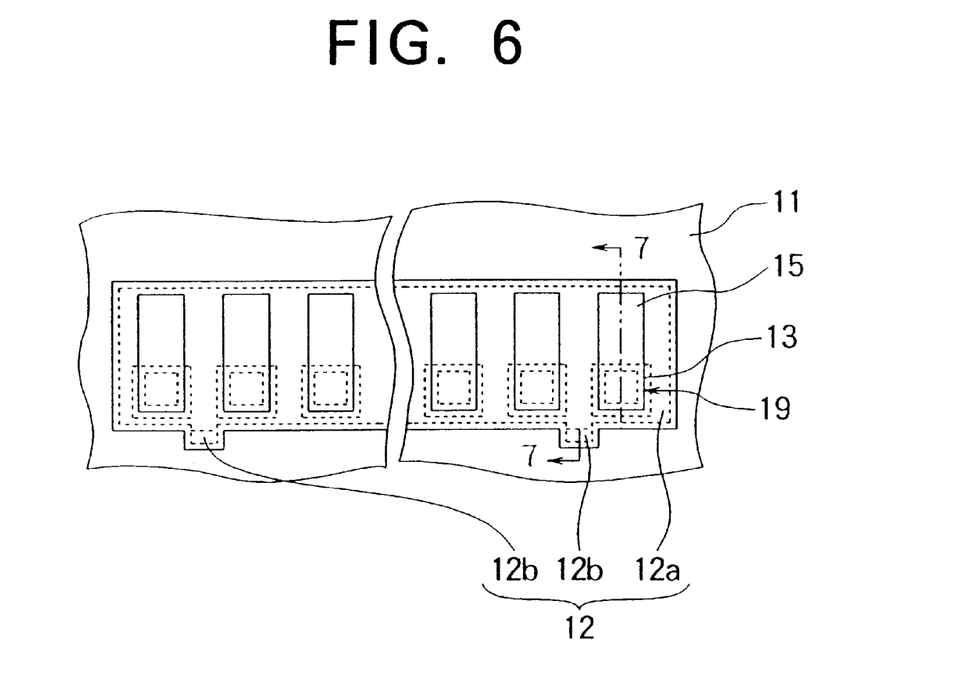
FIG. 6 is a plan view illustrating a third step in the above fabrication process.
Figure 7:
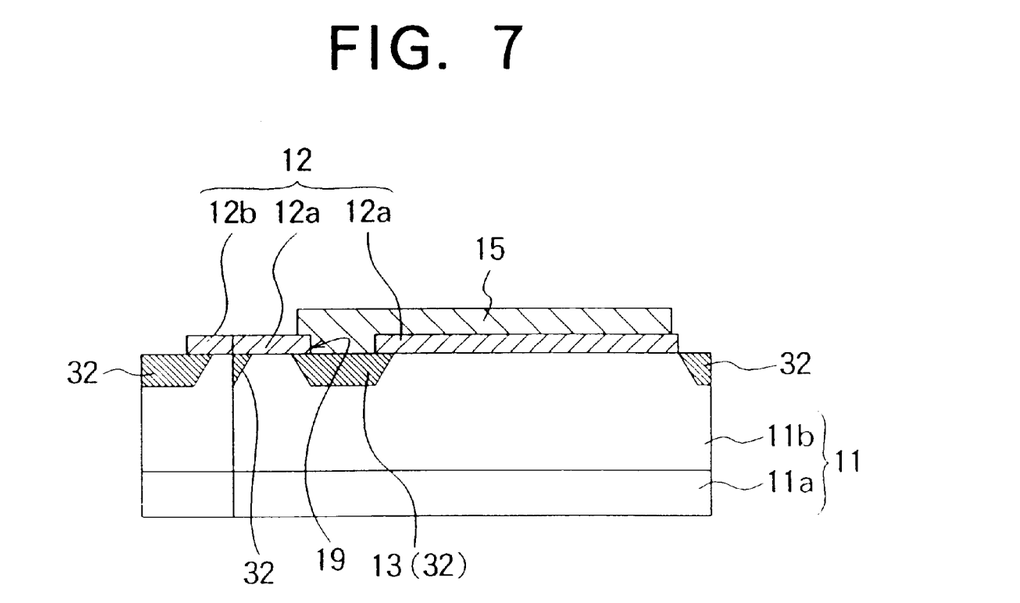
FIG. 7 is a sectional view through line 7—7 in FIG. 6.

Referring to FIG. 6, next the diffusion control film 30 is removed by a suitable method, and a layer of aluminum is deposited on the wafer surface and patterned by standard photolithography to form the p-electrodes 15. The aluminum can be deposited by electron-beam evaporation deposition, for example. The p-electrodes 15 are formed on top of the first part 12a of the combined mask 12, covering the diffusion windows 19. FIG. 7 shows a sectional view through the broken line 7—7 in FIG. 6.

Figure 8:
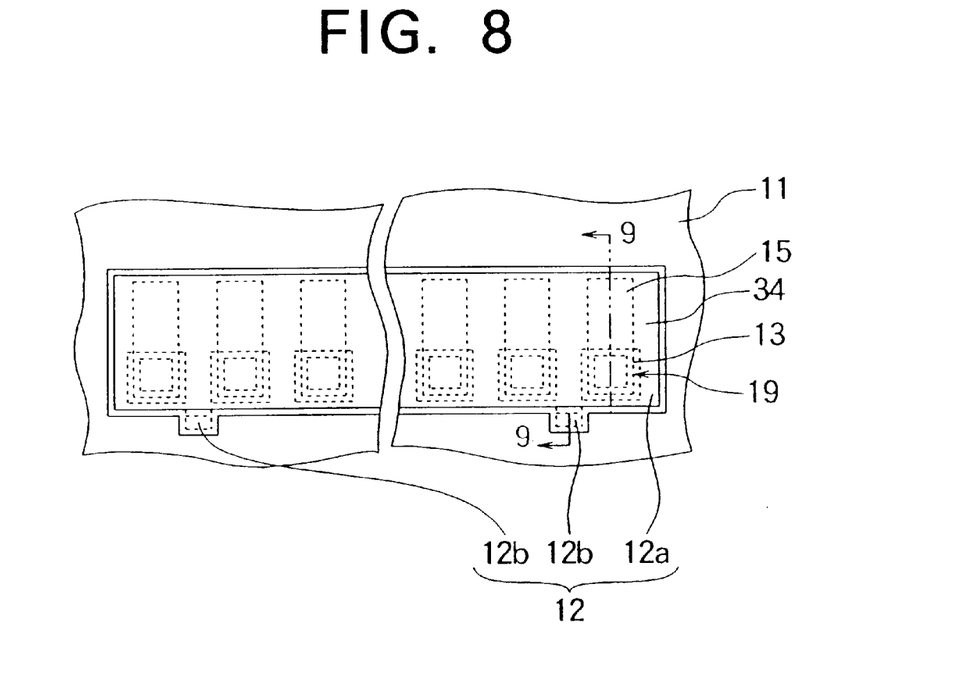
FIG. 8 is a plan view illustrating a fourth step in the above fabrication process.

Referring to FIG. 8, the wafer surface is now coated with a resist material, which is patterned to leave a resist film 34 covering an extent comprising nearly all of the first part 12a of the combined mask 12. In particular, the resist film 34 covers the p-electrodes 15. A small uncovered margin is left around the edges of the first part 12a of the combined mask 12. No resist film is left in areas outside the first part 12a of the combined mask 12.

Figure 9:
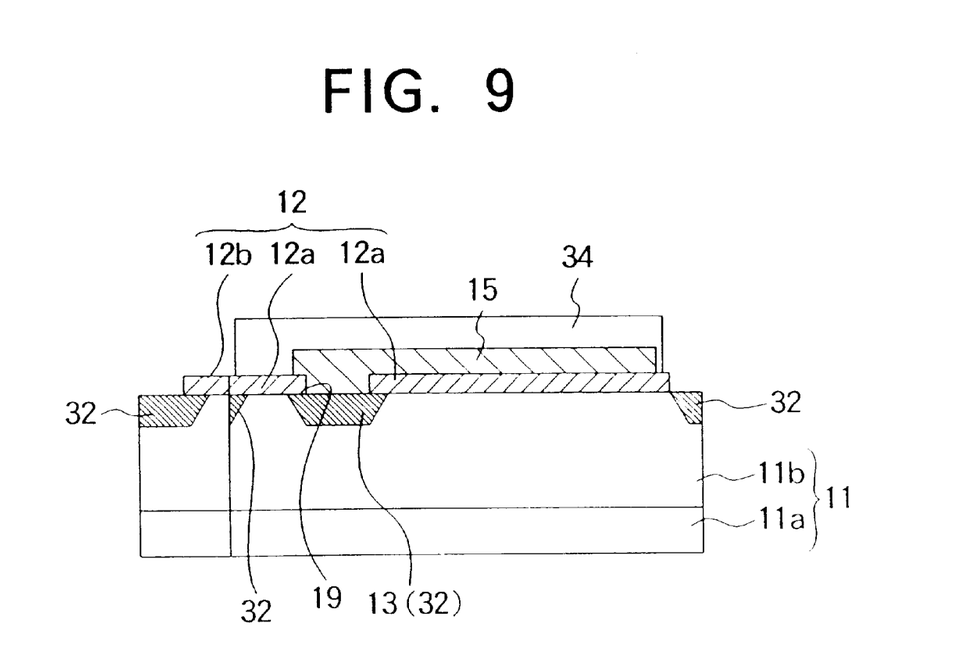
FIG. 9 is a sectional view through line 9—9 in FIG. 8.

FIG. 9 shows a sectional view through the broken line 9—9 in FIG. 8.

Figure 10:
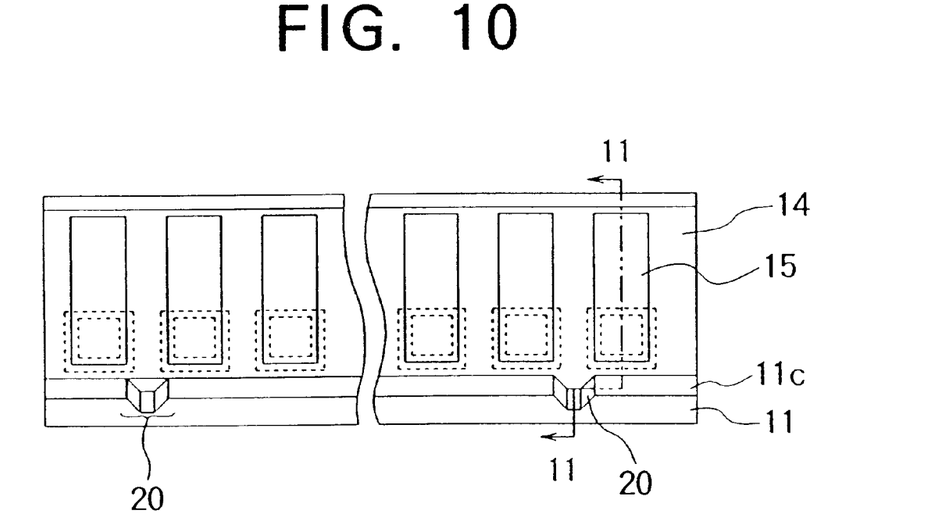
FIG. 10 is a plan view illustrating a fifth step in the above fabrication process.
Figure 11:
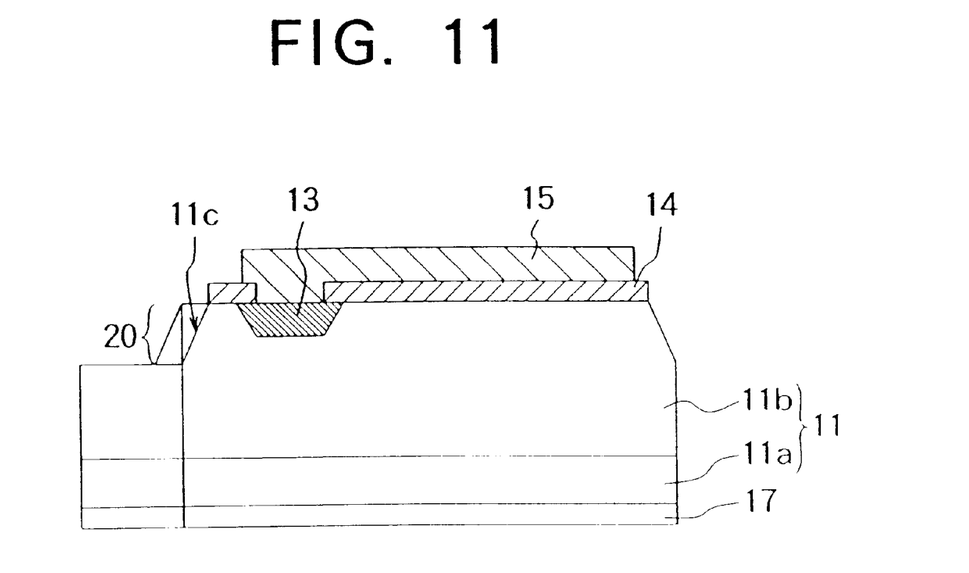
FIG. 11 is a sectional view through line 11—11 in FIG. 10.

Referring to FIGS. 10 and 11 (FIG. 11 is a sectional view through the broken line X—X in FIG. 10), the next step is an etching step, performed with an etchant that etches both the epitaxial GaAsP material and the zinc diffusion regions formed in the epitaxial layer 11b, but does not etch the resist film 14 or combined mask 12. A mixture of phosphoric acid, hydrogen peroxide, and distilled water, for example, can be used as the etchant. The etch is carried out to a depth of substantially 10 µm, which is twice the diffusion depth (5 µm), in the epitaxial layer 11b. The etchant also etches sideways to a distance of about 8 µm.

This etch leaves the light-emitting areas 13 embedded in a mesa in the epitaxial layer 11b, with the p-electrodes 15 resting on top of the mesa, and forms the emitting facet 11c and alignment marks 20. Next, the combined mask 12 is trimmed by further etching, using an etchant that does not etch the substrate 11, so as to remove the edges of the first part 12a and substantially all of the second parts 12b of the combined mask 12, thereby removing the overhang left by the mesa-forming etching step. The remaining part of the combined mask 12 becomes the $Al_2O_3$ film 14 shown in FIG. 1A. The resist 34 is removed by suitable means after the etching is completed.

Finally, the n-electrode 17 is formed by a suitable deposition method, and the wafer is diced to separate the LED array chips.

Figure 12:
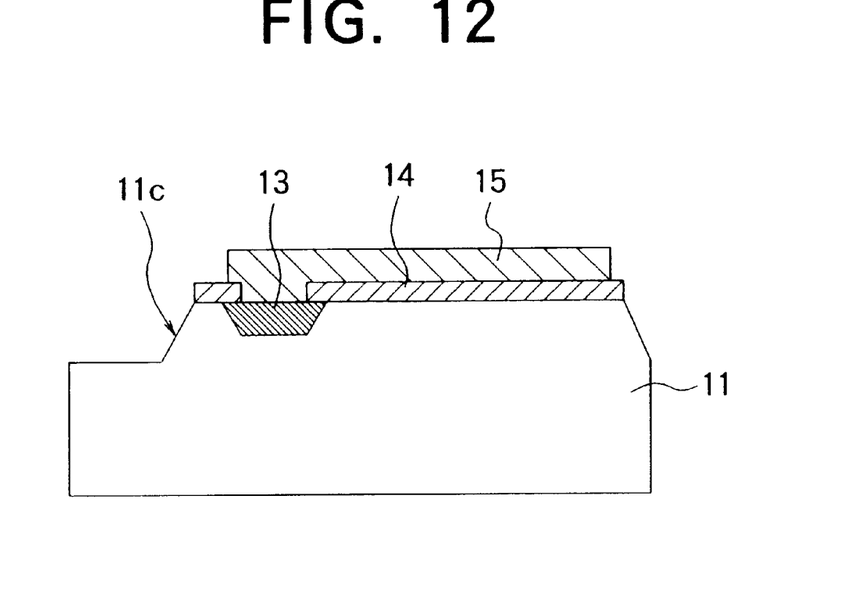
FIG. 12 is a sectional view illustrating the mesa configuration of the LED array chip for one orientation of the array.
Figure 13:
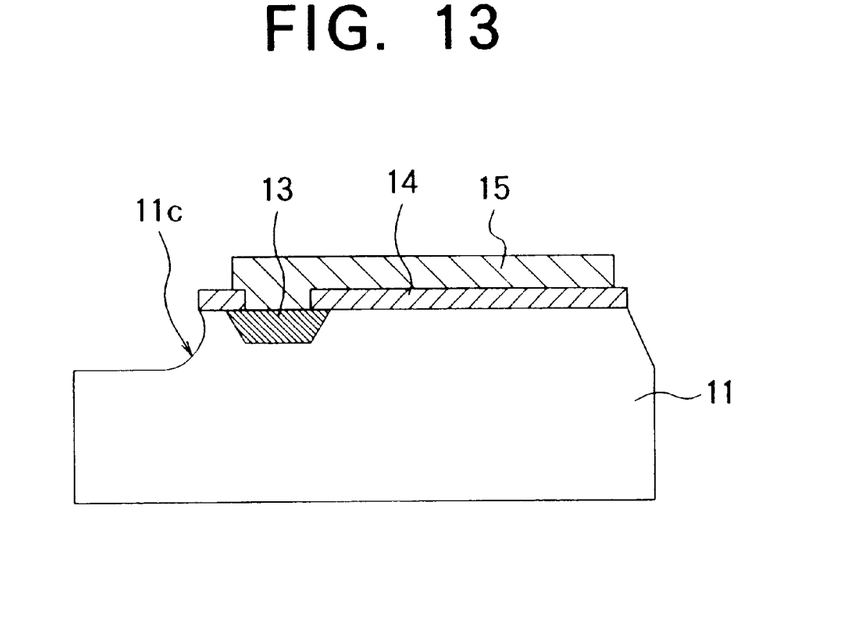
FIG. 13 is a sectional view illustrating the mesa configuration of the LED array chip for another orientation of the array.

The cross-sectional shape of the mesa formed by the mesa etching step varies depending on the orientation of the LED array chips 10 on the wafer. If the chips are oriented so that their arrays of light-emitting areas 13 are aligned parallel to the (01$\overline{1}$) plane of the GaAs layer 11a, the epitaxial layer 11b will be etched as shown in FIG. 12, forming a mesa with straight, slanted sides. If the arrays of light-emitting areas 13 are aligned parallel to the (01$\overline{1}$) plane, the sides of the mesa will be curved as shown in FIG. 13.

The LED array chips fabricated as described above can be attached to driver chips to form modules. The attachment is made on the top surface of the mesa, so that the driver chips can make electrical contact with the p-electrodes 15. The modules can then be bonded to a printed circuit board, as described below.

Figure 14:
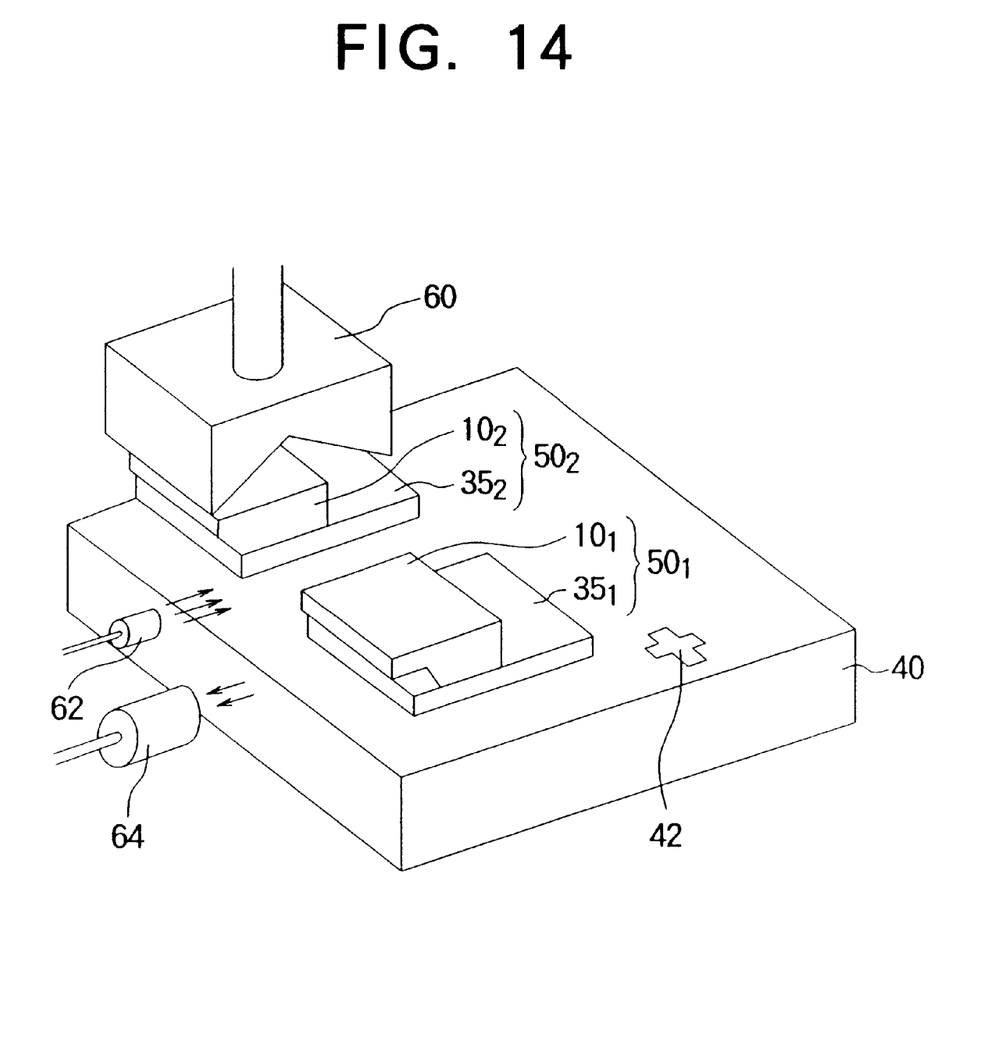
FIG. 14 is a perspective view illustrating the mounting of LED array chips and their driver chips on a printed circuit board.

FIG. 14 shows a perspective view of two modules $50_1$ and $50_2$ comprising respective LED array chips $10_1$ and $10_2$, which are attached to respective driver chips $35_1$ and $35_2$. The LED array chips are oriented upside-down, so the alignment marks are not visible in the drawing.

These modules $50_1$, and $50_2$ are bonded to a printed circuit board 40 having a reference mark 42. The bonding is performed by an automatic die bonding apparatus comprising a collet 60, a light source 62, a photosensor 64, and image processing and control circuits (not visible). The photosensor 64 is, for example, a charge-coupled device (CCD). The photosensor 64 and image processing circuits detect the positions of an alignment mark on a LED array chip illuminated by the light source 62.

First, module $50_1$ is placed on the printed circuit board 40 by the collet 60, and the position of at least one of the alignment marks on LED array chip $10_1$ is detected. The collet 60 is then controlled to adjust the position of the module $50_1$, so that the detected alignment mark or marks on LED array chip $10_1$ are in a certain predetermined positional relationship to the reference mark 42. When the desired position has been achieved, module $50_1$ is bonded to the printed circuit board 40 by melting an adhesive disposed under driver chip $35_1$.

The second module $50_2$ is then placed on the printed circuit board 40 by the collet 60, its position is adjusted so that the right alignment mark of LED array chip $10_2$ is a certain predetermined distance from the left alignment mark of LED array chip $10_1$, and module $50_2$ is bonded in place. Further modules are similarly positioned and bonded, maintaining the same fixed distance between adjacent alignment marks on different LED array chips.

Next the method by which the alignment marks are detected will be described in more detail.

Figure 15:
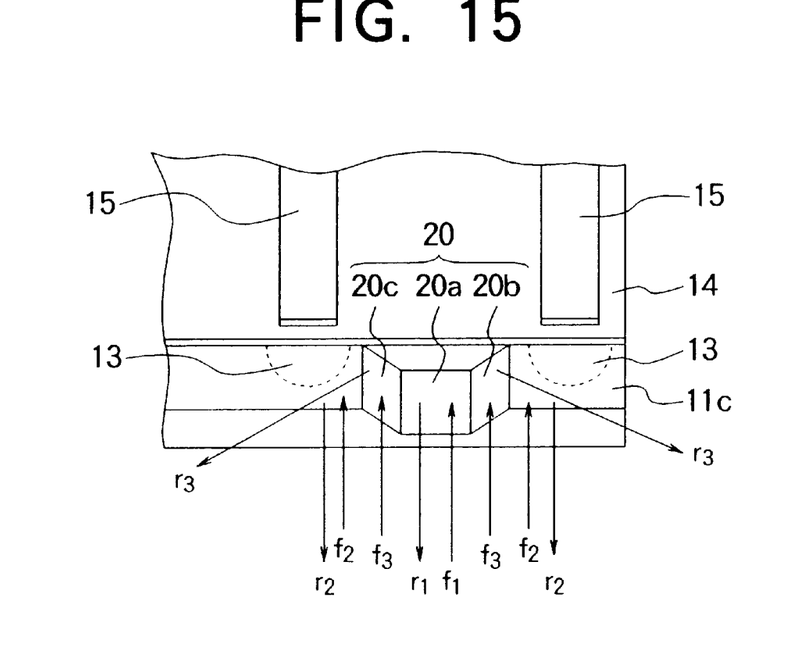
FIG. 15 is a frontal perspective view illustrating the reflection of light from the alignment mark.
Figure 16:
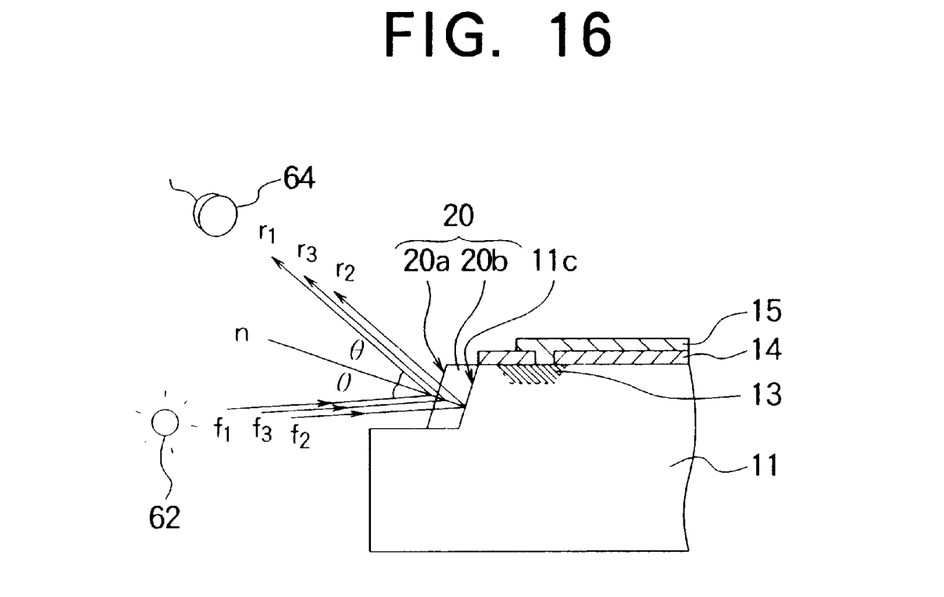
FIG. 16 is a sectional view illustrating the reflection of light from the alignment mark.

FIG. 15 shows an alignment mark 20 as seen at an angle from a position in front of the LED array chip, more specifically, as seen from the position of the photosensor 64 in FIG. 16. The mesa in FIGS. 15 and 16 has the shape shown in FIG. 12, with straight, slanted sides, but the following description also applies if the mesa has the shape shown in FIG. 13.

As shown in FIG. 16, the light source 62 is disposed at an angle θ with respect to a line n normal to the surface of the emitting facet 11c of the LED array chip, and is adapted to emit a parallel beam of light toward the LED array chip. The front surface 20a of the alignment mark 20 is substantially parallel to the surface of the emitting facet 11c, hence perpendicular to line n. The photosensor 64 is disposed at an equal but opposite angle −θ with respect to line n. Parallel rays $f_1$ and $f_2$ emitted from the light source 62 toward the front surface 20a of the alignment mark 20 and the emitting facet 11c are reflected to the photosensor 64, as indicated by the reflected rays $r_1$, and $r_2$ shown in FIGS. 15 and 16. Rays $f_3$ incident on the slanted sides $20_b$ of the alignment mark 20 are reflected at lateral angles, and their reflected rays $r_3$ do not reach the photosensor 64. The reflected light thus produces a dark-light pattern on the photosensor 64 with adequate contrast for recognition by the image processing circuits of the die bonding apparatus.

Figure 17:
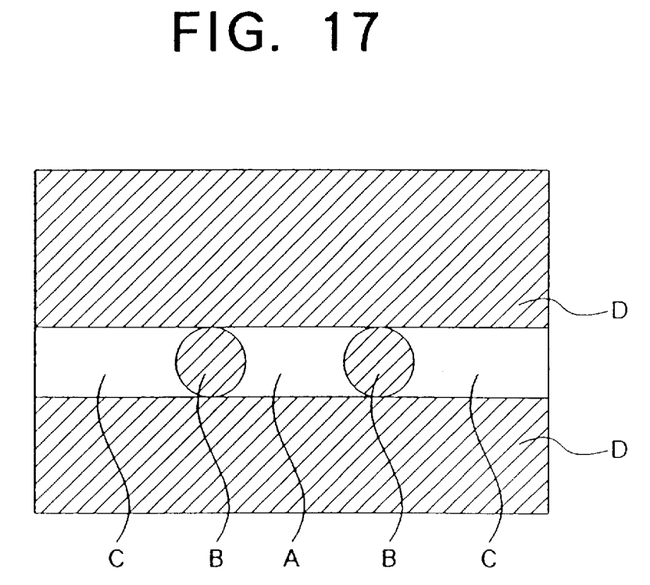
FIG. 17 illustrates a dark-light pattern from which the position of the alignment mark can be identified.

The dark-light pattern seen by the photosensor 64 is illustrated in FIG. 17. The bright area A in the center corresponds to the ray $r_1$ reflected from the front surface 20a of the alignment mark 20. The adjacent dark areas B correspond to the slanted sides 20b of the alignment mark 20, which do not reflect light from the light source 62 to the photosensor 64. The bright areas C correspond to the emitting facet 11c of the LED array chip, which is parallel to the front surface 20a of the alignment mark and also reflects light from the light source 62 to the photosensor 64. The dark areas D above and below correspond to the top surface of the LED array chip with the p-electrodes, and the diced surface below the emitting facet 11c; these surfaces face in directions such that they cannot reflect light to the photosensor 64.

The pattern in FIG. 17 is produced by two-dimensional image processing in the image processing circuits of the die bonding apparatus. The alignment mark 20 produces a clear contrast between dark and light image areas; the position of the alignment mark 20 is readily and accurately identifiable from the two dark spots B in the bright band comprising areas A and C. Since the alignment marks have a precise positional relationship to the light-emitting areas 13, both having been formed by means of the same combined mask 12, the positions of the light-emitting areas 13 are precisely known. Thus the LED array chips can be accurately positioned and bonded, maintaining the correct spacing between light-emitting areas throughout the array, including the spacing between light-emitting areas at the adjacent ends of one chip and the next. Positioning error due to misplacement of the alignment marks is substantially non-existent. The only positioning error is the error inherent in the bonding process itself, arising from the melting and curing of the adhesive.

The alignment marks described above have been positive relief features comprising projections from the emitting facet 11c, but negative relief features comprising depressions can also be formed, by altering the shape of the combined mask 12. Two steps in the fabrication of a LED array chip with negative-relief alignment marks will be described next.

Figure 18:
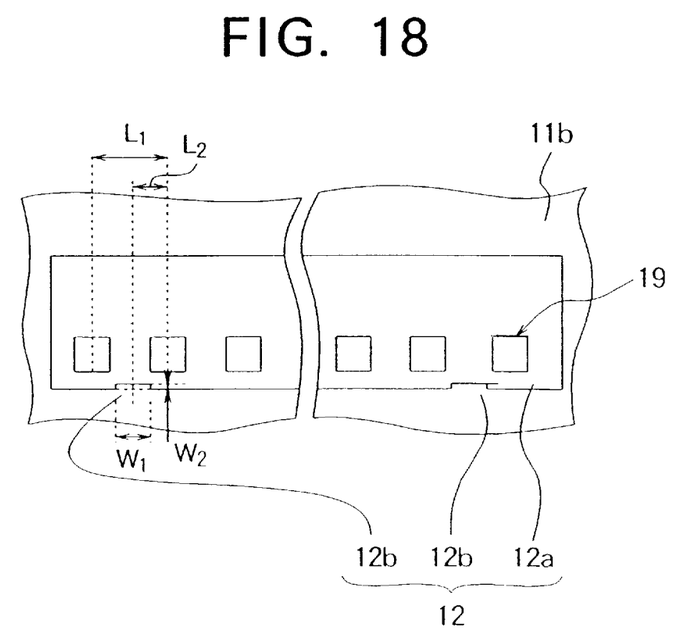
FIG. 18 is a plan view illustrating a first step in the fabrication of another LED array chip having alignment marks of the invented type.
Figure 19:
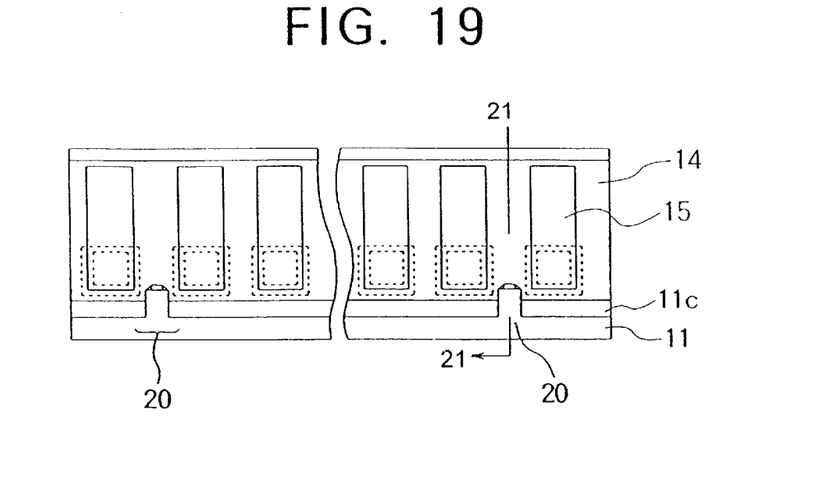
FIG. 19 is a plan view illustrating another step in the fabrication of this LED array chip.
Figure 20:
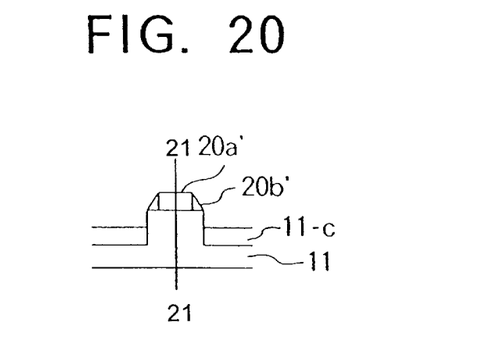
FIG. 20 is an enlarged plan view showing one of the alignment marks in FIG. 19.
Figure 21:
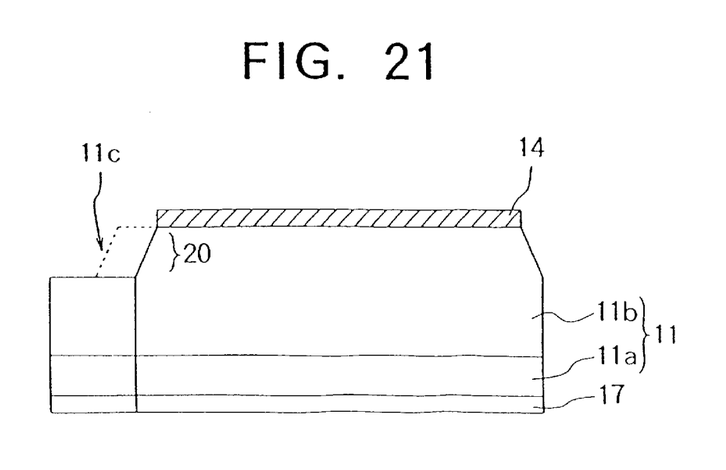
FIG. 21 is a sectional view through line 21—21 in FIGS. 19 and 20.

FIG. 18 illustrates the mask formation step. The second part 12b of the combined mask 12 comprises rectangular recesses in an edge of the first part 12a. FIG. 19 illustrates the mesa etching step, in which the alignment marks 20 are formed as depressions in the emitting facet 11c. FIG. 20 is an enlargement of one of these alignment marks, showing that the alignment mark has a rear surface 20a' parallel to the emitting facet 11c, flanked by surfaces 20b' that are not parallel to the emitting facet 11c. FIG. 21 is a sectional view through line 21—21 in FIGS. 19 and 20, showing that the alignment mark 20 is recessed from the surface of the emitting facet 11c.

The alignment marks shown in FIGS. 19 to 21 produce a high-contrast dark-light pattern similar to that shown in FIG. 17, and can be recognized in the same way. Accurate alignment is thus possible with alignment marks comprising either positive or negative relief. Negative-relief alignment marks can be formed with various shapes.

Although the preceding description has been given in relation to an edge-emitting array, the invention is also applicable to surface-emitting LED arrays. Moreover, the LED array chips need not be bonded to their driver ICs to form modules; the invention is also applicable when the LED array chips are bonded directly to the printed circuit board, or to another type of supporting surface.

The die bonding apparatus need not employ a single light source 62 emitting a parallel beam of light, and the photosensor 64 need not be positioned to receive light reflected from the front face 20a of the alignment mark. For example, a pair of parallel-beam light sources may be employed, and a pair of photosensors may be positioned to receive light reflected from the slanting sides 20b of the alignment mark, instead of light reflected from the front face 20a and from the emitting facet 11c. In this case the areas marked B in FIG. 17 will be light, and areas A and C will be dark. The illumination and light-sensing conditions can be altered according to the geometrical configuration of the emitting facet 11c and alignment mark 20 so as to obtain an optimal light-dark pattern.

The light-emitting areas 13 need not be formed by diffusion; they can be formed by ion implantation, for example, using the same type of combined mask 12.

Those skilled in the art will recognized that other variations are possible within the scope claimed below.

What is claimed is:

1. A method of forming an alignment mark and an array of light-emitting diodes in a semiconductor substrate, comprising the steps of:

forming a combined mask on a surface of said semiconductor substrate, said combined mask having a first part with windows for creating said light-emitting diodes, and a second part for crating said alignment mark;

doping said semiconductor substrate, where not covered by said mask, with an impurity, thereby forming light-emitting areas of said light-emitting diodes;

covering an extent of said first part of said combined mask, comprising at least said windows, with an etching resist; and etching said semiconductor substrate with an etchant that does not etch said etching resist and does not etch said combined mask, thereby forming said alignment mark by creating topographic relief in said semiconductor substrate, wherein said step of etching forms a mesa in said semiconductor substrate, said light-emitting diodes are edge-emitting light-emitting diodes, and said mesa has a facet through which said light-emitting diodes emit light.

2. The method of claim 1, wherein said second part of said combined mask comprises a projection from said first part of said combined mask.

3. The method of claim 1, wherein said second part of said combined mask comprises a recess in an edge of said first part of said combined mask.

4. The method of claim 1, wherein said step of etching forms a mesa in said semiconductor substrate, said light-emitting diodes are edge-emitting light-emitting diodes, and said mesa has a facet through which said light-emitting diodes emit light.

5. The method of claim 1, wherein said alignment mark comprises a projection from said facet.

6. The method of claim 1, wherein said alignment mark comprises a depression in said facet.

7. The method of claim 1, wherein said alignment mark has a trapezoidal shape.

8. The method of claim 1, wherein said alignment mark has a triangular shape.

9. The method of claim 1, wherein said alignment mark has a pinched shape comprising a narrow part disposed between two wider parts.

10. A method of aligning a plurality of edge-emitting diode array chips having respective topographic relief features to form a single light-emitting diode array on a supporting surface having a reference mark, comprising the steps of:

detecting relative positions of said reference mark and a topogaphic relief feature on a first one of said edge-emitting diode array chips;

moving said first one of said edge-emitting diode array chips on said supporting surface to a predetermined position relative to said reference mark on said supporting surface;

detecting relative positions of a topographic relief feature on said first one of said edge-emitting diode array chips and a topographic relief feature on a second one of aid edge-emitting diode array chips; and movind said second one of said edge-emitting diode array chips to a predetermined position relative to said first one of said edge-emitting diode array chips, wherein each of said edge-emitting diode array chips has a semiconductor substrate and an array of light-emitting diodes with light-emitting areas formed in the semiconductor substrate, said edge-emitting diode array chips have respective edges with facets from which light is emitted, and said topographic relief features are formed in said facets in a predetermined positional relationship to said light-emitting areas.

11. The method of claim 10, wherein said steps of detecting relative positions both comprise the further steps of:

illuminating said first one of said edge-emitting diode array chips from a predetermined direction; detecting light reflected from said first one of said edge-emitting diode array chips with a photosensor disposed in a certain direction in relation to said first one of said edge-emitting diode array chips;

processing a signal from said photosensor to obtain a dark-light pattern; and recognizing the topographic relief feature on said first one of said edge-emitting diode array chips from said dark-light pattern.

12. The method of claim 10, wherein said edge-emitting diode array chips are placed directly on said supporting surface.

13. The method of claim 10, wherein said edge-emitting diode array chips are attached to respective driver chips before said steps of detecting and said steps of moving, and said driver chips are placed on said supporting surface.

* * * * *